(12) United States Patent
Jacobsen et al.

(10) Patent No.: US 7,187,165 B2
(45) Date of Patent: Mar. 6, 2007

(54) METHOD AND SYSTEM FOR IMPLICITLY ENCODING PREFERRED PROBING LOCATIONS IN A PRINTED CIRCUIT BOARD DESIGN FOR USE IN TESTER FIXTURE BUILD

(75) Inventors: Chris R. Jacobsen, Fort Collins, CO (US); Kenneth P. Parker, Fort Collins, CO (US); John E. Herczeg, Boulder, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/010,074

(22) Filed: Dec. 10, 2004

(65) Prior Publication Data

US 2006/0125496 A1 Jun. 15, 2006

(51) Int. Cl.
*G01R 31/02* (2006.01)
*G01R 31/28* (2006.01)
*G06F 17/50* (2006.01)

(52) U.S. Cl. .................................. 324/158.1; 324/754

(58) Field of Classification Search ................ 324/754, 324/755, 758, 761, 519, 765, 158.1
See application file for complete search history.

(56) References Cited

U.S. PATENT DOCUMENTS

| | | | | |
|---|---|---|---|---|
| 6,130,547 A | * | 10/2000 | Kato ........................... | 324/761 |
| 6,259,963 B1 | * | 7/2001 | Naomachi ................... | 700/121 |
| 6,269,963 B1 | * | 8/2001 | Hall ........................... | 700/121 |
| 6,292,004 B1 | * | 9/2001 | Kocher ....................... | 324/754 |
| 6,358,918 B1 | * | 3/2002 | Schlag et al. ................ | 716/8 |
| 6,587,989 B2 | * | 7/2003 | Rosenbaum et al. .......... | 716/1 |
| 6,839,885 B2 | * | 1/2005 | Ahrikencheikh ............... | 716/9 |
| 6,938,231 B2 | * | 8/2005 | Yoshida et al. ................ | 716/5 |
| 7,071,717 B2 | * | 7/2006 | Hoke et al. .................. | 324/755 |

* cited by examiner

*Primary Examiner*—Paresh Patel
*Assistant Examiner*—Roberto Velez (57) ABSTRACT

Techniques for automating test pad insertion in a printed circuit board (PCB) design and fixture probe insertion in a PCB tester fixture are presented. A probe location algorithm predictably determines respective preferred probing locations from among respective sets of potential probing locations associated with a number of respective nets in a PCB design. Test pads, preferably in the form of bead probes, are added to the PCB design at the respective preferred probing locations along with, where feasible, one or more alternate probing locations chosen from among remaining ones of the respective sets of potential probing locations. During fixture design, nets with multiple test pads implemented in the PCB design are processed by the same probe location algorithm used during PCB design to determine the associated preferred and alternate probing locations for said respective nets. Fixture probes are preferably inserted in the PCB tester fixture design at respective preferred probing locations such that tips of said respective fixture probes exactly align with corresponding preferred test pads of a PCB implemented in accordance with the PCB design should the PCB be mounted in a printed circuit board tester fixture implemented in accordance with the PCB tester fixture design.

14 Claims, 7 Drawing Sheets

METHOD AND SYSTEM FOR IMPLICITLY ENCODING PREFERRED PROBING LOCATIONS IN A PRINTED CIRCUIT BOARD DESIGN FOR USE IN TESTER FIXTURE BUILD

BACKGROUND OF THE INVENTION

The present invention relates generally to printed circuit board testing, and more particularly to techniques for implicitly encoding and decoding preferred probing locations in a printed circuit board design.

Electronic products typically contain at least one printed circuit board (PCB). A PCB generally includes a plurality of electronic components that are electrically connected together by electrical paths called "nets" that are formed of various combinations of conductive traces, vias, wires, and solder, to form an operational circuit that performs a given function. A conventional PCB development cycle is illustrated by the Gantt chart shown in FIG. 1. As illustrated, the conventional PCB development cycle includes three main stages—namely, PCB design, test development, and fixture development. As shown, each of the stages is generally serial in nature, requiring a number of steps to be performed. The time-to-market of the PCB, and hence of the product that utilizes the PCB, is affected by the duration of time spent in completing each of the steps of each stage. While actual duration values for each step are shown in FIG. 1, it is to be understood that these values are merely illustrative of a typical development cycle for a typical PCB design and will be different from PCB design to PCB design, varying according to PCB design complexity, available tools, actual test development techniques applied, designer and test experience, etc.

Where possible, given the current state of the art of available development tools in the market, many steps involved in PCB design, test development and fixture development are automated, either fully or at least partially. For example, large automated industrial CAD development systems have been developed that allow floorplanning, schematic capture, trace routing, design verification, and even test generation. These automated features have significantly improved the time-to-market of an integrated circuit assembly. In the past, the addition of test pads to the circuit during the PCB design stage and the addition of board pushers for push-down top gate fixtures during the fixture development stage have been difficult to automate. The reasons for this are multifold, a better understanding of which will become clearer through a more detailed description of the PCB development process.

To this end, during the PCB design stage, a CAD system is used to design and lay out the PCB, including schematic capture and component and trace layout of the PCB under development. After design and layout of the circuit are complete, conventionally the circuit designer manually adds test pads for board testing (such as in-circuit test (ICT)), the goal being to provide probing access on all nets, or at least on all nets of interest, on the PCB. Conventional test pads are implemented as extensions of traces on the exposed trace layers in that they lie in the same plane as one of the exposed trace layers and are formed integrally with traces on the exposed trace layer using the same trace material. Test pads are typically round, square, or some other planar geometric shape and have a surface area large enough to accommodate a probe head $_{[KP1]}$so that when the PCB is probed at the test pad, the probe does not contact other traces or components on the PCB. Furthermore, the size of a test pad is also determined by pointing errors in probe placement that may cause lateral offsets. Thus a test pad may be somewhat larger than the probe head itself, to assure a good probability of hitting it. Because conventional test pads occupy area on the trace layer, the addition of test pads to the PCB design often require rerouting of nets of the PCB design. The addition of test pads to the design using conventional techniques also carries risks in adversely affecting surrounding circuitry or changing the transmission line characteristics of the traces over which high-speed signals are communicated. Accordingly, whenever a test pad is added to the PCB design using conventional techniques, the effects of the design change must be either calculated or simulated in order to ensure that the location of the test pad and its associated changes to the design do not adversely affect circuit operation. Because the test pad insertion step requires mainly manual effort and is iterative in nature, this step, as illustrated in FIG. 1, might add several days (e.g., 5 days in the example shown) to the PCB design process, yet still not result in 100% probing access.

Figure 1:
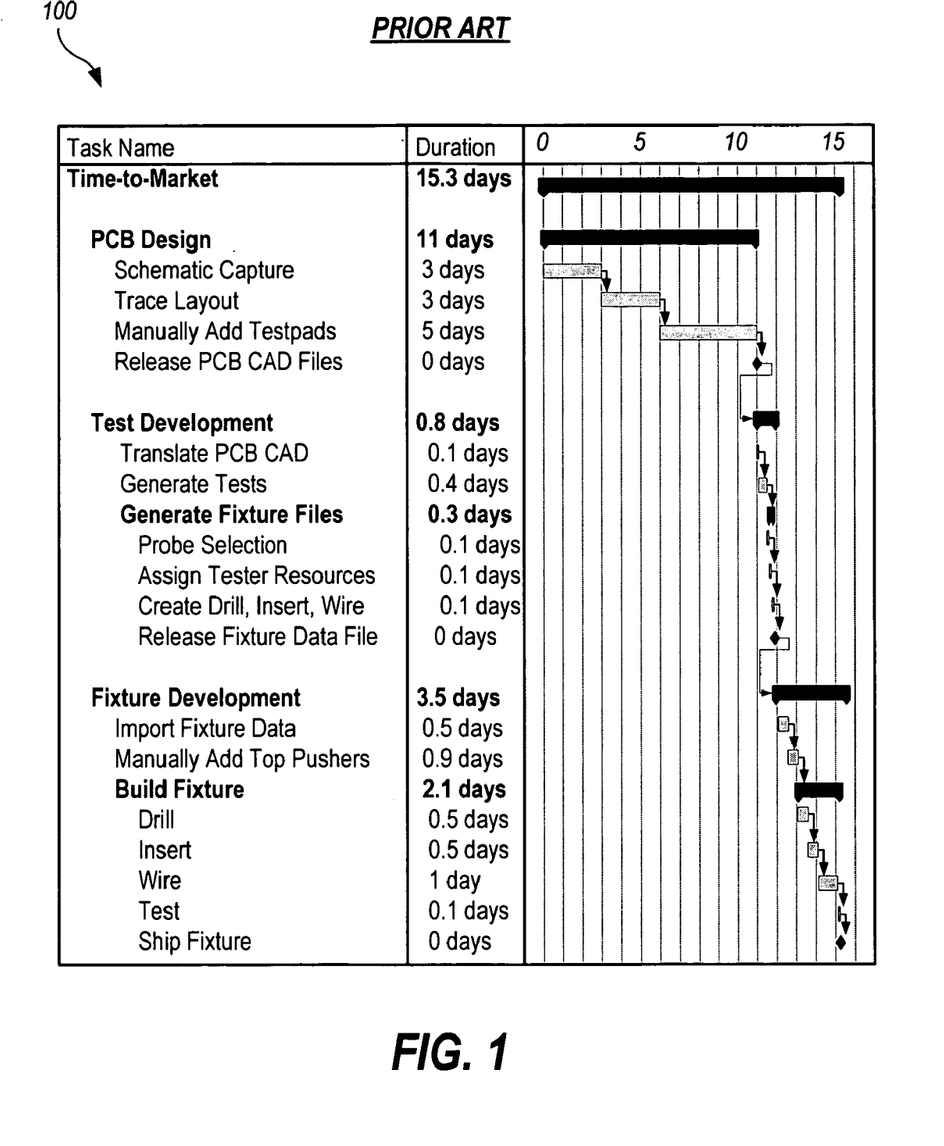
FIG. 1 is a Gantt chart illustrating a PCB development cycle for a typical PCB design using prior techniques.
Figure 2:
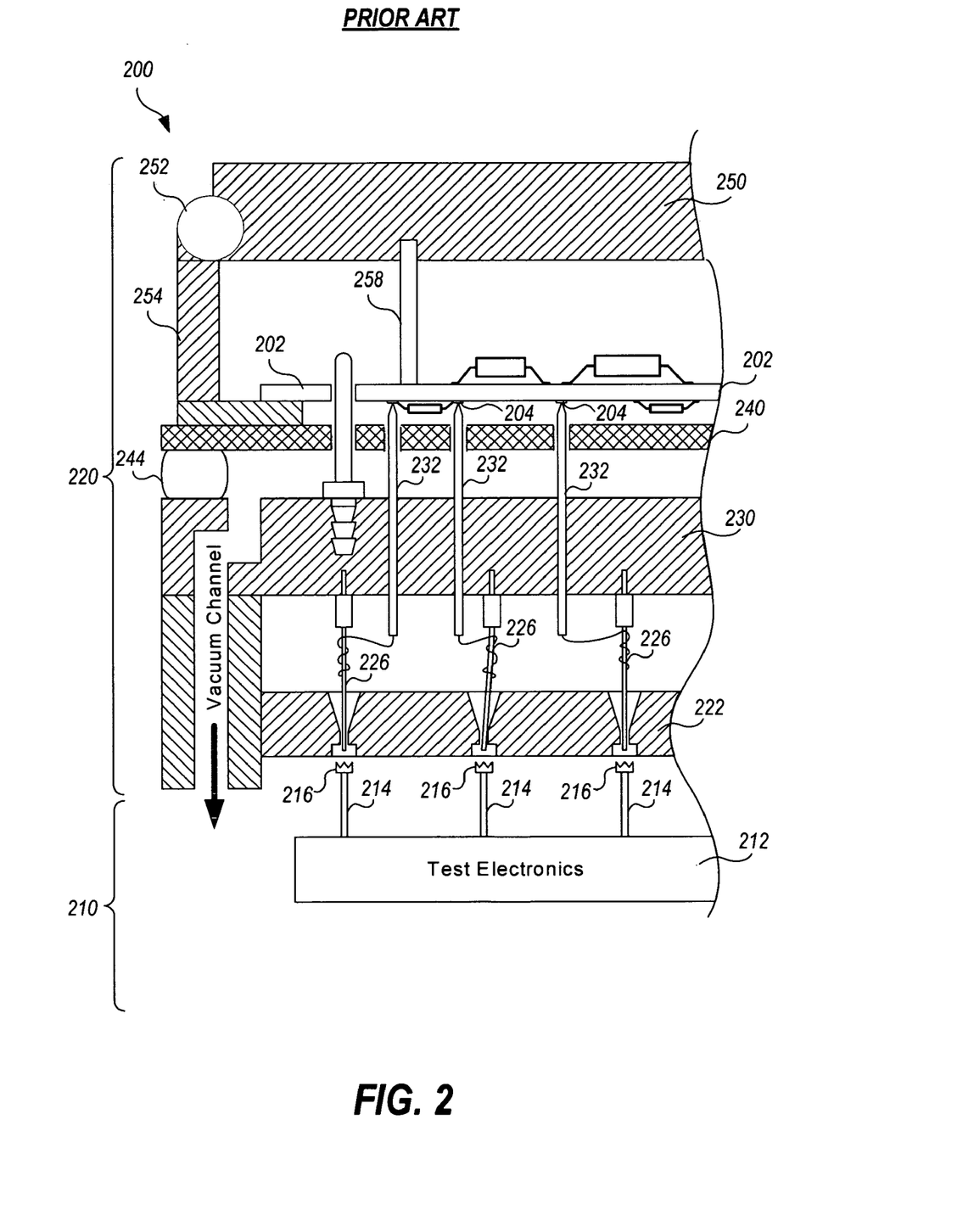
FIG. 2 is a side cut-away view of a portion of a tester with a test fixture and PCB under test mounted thereon.

Referring again to the PCB development cycle of FIG. 1, once the design has been captured, routed, and test pads are added, the CAD data files representing the PCB design with test pads inserted are then released for test development. In-Circuit Test (ICT) is a well-known test methodology that includes testing hardware that can probe nets of the PCB through a combination of tester relays, tester interface pins, and custom fixturing. More particularly, FIG. 2 illustrates a portion of an ICT tester environment 200. The tester environment 200 includes an automated tester 210 that implements the test electronics 212, including measurement circuits, relays, control electronics, etc. The tester 210 provides a field of tester interface pins 214, which are arranged in a fixed configuration and may be connected to various measurement circuits within the test electronics 212 by way of electronically controlled relays (not shown). Because the tester interface pin field is a fixed configuration, in order to probe test pads 204 on a PCB under test 202, the PCB 202 is generally mounted in a customized fixture 220 which operates as an adapter between fixed configuration tester interface pins 214 and various test pads 204 on the PCB 202.

The test fixture 220 includes a probe protection plate 240, standard spring probes 232 whose tips exactly correspond to test pads 204 on the bottom of the PCB under test 202, a top push-down gate 250 which opens and closes by way of a hinge 252, spacers called board pushers 258 mounted in the bottom of the push down gate 250 which limit the deflection of the PCB 202 under vacuum loading, a probe mounting plate 230 in which the spring probes 232 are installed, personality pins 226 which are wired to the spring probes 232, and an alignment plate 222 which aligns the wirewrap tails of the personality pins 226 into a regularly spaced pattern so that they line up with tester interface pins 214 mounted in the tester 210. As known in the art, a spring probe is a standard device, commonly used by the test community, which conducts electrical signals and contains a compression spring and plunger that move relative to the barrel and/or socket when actuated. A solid probe also conducts electrical signals but has no additional parts which move relative to each other during actuation.

During test, the PCB under test 202 is pulled down by vacuum or other known mechanical means so that the test pads 204 on the bottom of the PCB under test 202 contact the tips of the spring probes 232. The sockets of the standard spring probes 232 are wired to personality pins 226, and the alignment plate 222 funnels the long, flexible personality pin tips into a regularly spaced pattern. The tips of personality pins 226 contact the tester interface pins 214 mounted in the tester 210. Once electrical contact between the PCB under test 202 and the tester 210 is established, in-circuit or functional testing may commence.

Referring back to FIG. 1, during the test development stage the CAD data is translated as necessary into native formats of the test platform (i.e., formatted into a format expected by the ICT tester), from which tests are developed. Most of today's PCB testers come with software packages that can automatically generate tests when full access is available. Some testers, for example, the Agilent 3070 In-Circuit Test (ICT) Board Test System, manufactured by Agilent Technologies, Inc. having headquarters in Palo Alto, Calif., also include fixture generation software that automatically generates fixture design files needed to build an ICT fixture. This fixture generation software chooses probe locations on a net by net basis to minimize board flex in fixtures. Using conventional test pad fabrication technologies, however, implementation of alternate plural probing locations along the nets are rare since adding even a single test pad to a net, as described above, is so painful in terms of board real estate, risk of adverse impact to circuit performance, time, and cost.

Recently, a new technology for implementing test access structures (i.e., test pads) on PCBs has been introduced. Test access structures, herein called "bead probes", that are fabricated using this new technology are implemented along the z-dimension, in an x-, y-, z-coordinate system, of traces printed along an x-y plane implemented as an outer layer of the PCB. Each bead probe is conductively connected to a trace at a desired probing location directly on top of the trace and along the z axis of the x-, y-, z-coordinate system above an exposed surface of the printed circuit board to be accessible for electrical probing by an external device. Because bead probes are implemented along the z-dimension along traces in an x-y plane, they take up no real estate in the x-y dimension. Thus, the use of bead probe technology allows test pads in the form of bead probes to be implemented anywhere along a net of a PCB without having to alter the PCB design. In addition, research has shown that bead probes may be fabricated along existing nets of the PCB design without impacting the high-speed electrical characteristics of the net (See "A New Probing Technique for High-Speed/High Density Printed Circuit Boards", International Test Conference, October 2004, the entire document of which is incorporated herein by reference for all that it teaches). Bead probes are described more fully in U.S. patent application Ser. No. 10/670,649, to Parker et al., entitled "Printed Circuit Board Test Access Point Structures and Method for Making the Same", filed Sep. 24, 2003 and assigned to the assignee of interest herein, the entire disclosure of which is incorporated herein by reference for all that it teaches. With the advantages of the new bead probe technology, the industry is quickly embracing bead probes as the new methodology for test pad implementation. Further, due to the non-impact on the PCB design and circuit performance by the addition of bead probes to the PCB, multiple bead probes per net (where practically feasible) can be easily and quickly added to allow for alternate probing locations.

Again referring to FIG. 1, once the test pad locations are determined and added to the PCB design, fixture design files for ICT testers containing fixture build information are created. Fixture design files typically include specifications for the board outline coordinates, tooling pin holes and locations, drill, probe and socket insertion, and wiring information, but leave the decision of other fixture components such as board pushers and fasteners (e.g., retainer screws) to the fixture builder's discretion. The fixture builder must typically meet certain criteria such as maximum force per square unit, maximum board flex thresholds, etc. To meet these criteria, the fixture builder must consider the layout of the probes 232. An average fixture may include 3000 to 4000 probes 232, each exerting, for example, 8 ounces of force against the bottom of the PCB 202 during test. This works out to nearly a ton of force pushing upward against the PCB 202. If the counteracting forces of the probes and board pushers are not evenly distributed across the entire board, the PCB will flex and may cause faulty or even fatal test results. Accordingly, most ICT fixtures include a top push-down gate 250 with push-down spacers, herein called board pushers 258, to counteract the fixture probe forces as shown in FIG. 2. The fixture designer must balance the board by strategically positioning the board pushers in the fixture to counteract the forces of the fixture probes so as to eliminate or significantly reduce board flex. However, with the increasing availability of alternate probing locations on many of the nets in PCB designs that now utilize bead probes as the test pad implementation of choice, fixture designers are now often faced with having to choose which one of several alternate locations to implement the fixture probe servicing that net. Whereas all alternate probing locations on a net will allow probing of that net, on the larger scale, when taking into account the probing locations of other nets, not all probing locations are equal in terms of overall board flex. In other words, there is a "best" set of probing locations (one probe per net) that results in minimized board flex. However, unless the fixture designer is privy to that information, the fixture designer is faced with the daunting task of choosing fixture probe locations, one per net, from among possibly many locations per net, in which to implement fixture probes for probing the PCB during test. If the "best" set of probing locations is not selected, board flex may result that exceeds minimum specifications for optimal probing. Currently, is no existing automated technique for determining preferred probing locations in a fixture. Instead, the fixture probe and board pusher layout is usually designed manually after importing the fixture files resulting from the PCB design into a CAD tool (typically AutoCAD). Board pusher layout can be time-consuming, and since done manually, may not truly minimize board flex.

It is clear from the above description of the PCB development process that it would be desirable to automate the determination of fixture probe locations in the fixture design process. It would further be desirable to automate the determination of the "best" set of fixture probe locations (or "preferred locations") for PCB designs that implement multiple test pads on many of the nets to allow for alternate probing locations on these nets. It would further be desirable to utilize bead probe technology to implement multiple test pads along nets that can physically accommodate additional bead probes in order to provide a set of alternate probing locations for optimization of probe locations to reduce board stress while at the same time allowing some flexibility in the probing locations to accommodate fixture components such as board pushers. It would also be desirable to automate the designation of preferred and alternate probing locations for those nets that support alternate probing locations. It would further be desirable to implicitly encode the preferred probing locations in the PCB design itself to allow fixture design and build directly from the PCB design.

SUMMARY OF THE INVENTION

The present invention is a technique for automating the determination of fixture probe locations in the design process of PCB tester fixtures for PCBs that implement sets of alternate probing locations for at least some of the nets. The invention preferably also determines the "best" set of fixture probe locations (or "preferred locations") for PCB designs that implement multiple test pads on many of the nets to allow for alternate probing locations on these nets. The invention also teaches a technique for implicitly encoding the preferred probing locations in the PCB design itself to allow disclosure of the preferred probing locations only to authorized fixture builders.

According to a preferred embodiment of the invention, a probe location algorithm determines preferred and alternate locations of bead probes along nets of the PCB design. Bead probes are inserted in the PCB design at all of the preferred and alternate bead probe locations. The same probe location algorithm is then used during fixture design/build to determine the preferred probing locations. Because the probe location algorithm is the same as that used during PCB design to determine placement of probing locations, including the preferred and alternate bead probe locations, the preferred bead probe locations are implicitly encoded in the PCB design itself, and the probe location algorithm operates as decoder for identifying the preferred fixture probe locations corresponding to the preferred bead probe locations. Implicit preferred probing location encoding/decoding may therefore be used to prevent unauthorized fixture design/build by providing the probe location algorithm only to authorized fixture designers/builders. Without the probe location algorithm, the preferred probing locations are not distinguishable from the alternate probing locations in the PCB design. Without the probe location algorithm which operates as a preferred probing location decoder, unauthorized fixture builders have difficulty in building optimized fixtures for the PCB design in terms of minimizing board stress due to probing. This implicit preferred probing location encode/decode scheme therefore assists in protecting relationships between PCB design companies and preferred fixture build vendors by raising a strong barrier to the unauthorized fixture builder's ability to build optimized tester fixtures from only the PCB design.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

For purposes of clarity, the following terms are defined:

"net"—a signal transmission line which passes signals between two or more endpoints over an electrically conductive path; may be implemented as one or more of any of, including combinations of, the following: a trace, a via, a wire, a component lead, a solder ball, a wire bond, or any other electrically conductive element electrically connected between the two or more endpoints and through which the signal passes;

"test pad"—a point on a net accessible for probing, typically characterized by a surface area large enough to accommodate a probe head;

"fixture probe"—an electrically conductive element of a tester fixture which operates as a passive transmission line at least between a first end and a second end of the electrically conductive element, the first end configured to electrically contact a test pad of a circuit and the second end configured to electrically contact another electrical component of interest, such as a tester interface pin, a test pad of a wireless fixture PCB, a node of a tester measurement circuit, etc.).

Figure 3:
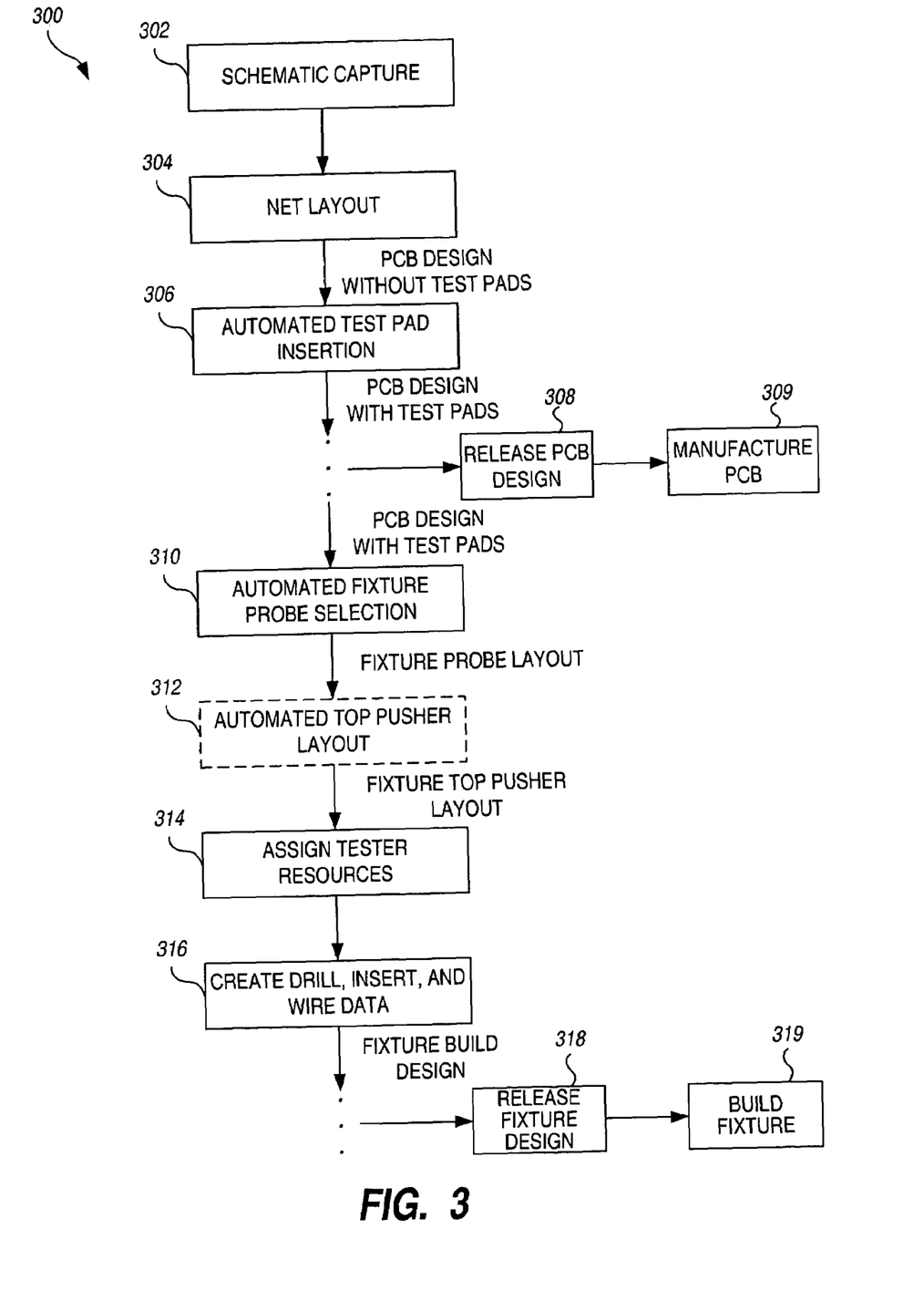
FIG. 3 is an operational flowchart illustrating a streamlined automated PCB development cycle in accordance with the invention.

According to one aspect of the present invention, a technique is provided for automating the determination of fixture probe locations in the design process of PCB tester fixtures for PCBs that implement sets of alternate probing locations for at least some of the nets. In particular, as shown in FIG. 3, a PCB design without test pads is generated through schematic capture (step 302) and net layout (step 304). Automated test pad insertion (step 306) automatically determines preferred and, where feasible, alternate probing locations for nets of the PCB and bead probes are added to the design at all preferred and alternate probing locations. In the preferred embodiment, a probe location algorithm selects a preferred and, where the net is long enough, one or more alternate bead probe locations from a number of potential bead probe locations. Any point along an exposed portion of a given net is considered a potential bead probe location for that net. However, for practical purposes in terms of processing time and desirability of discrete bead probes, the number and locations of the potential bead probes locations may be limited according to parameters such as minimum distance between bead probes, length of the net, etc. At the end of the PCB design stage, the PCB design with added test pads is released (step 308) for PCB fabrication (step 309).

Meanwhile, during the test and fixture development stages, the locations of the probes in the fixture must be determined in order to assign suitable tester resources to probing the various nets. Accordingly, during the test development stage, a novel automated fixture probe selection step (step 310) is performed to find the preferred, and where practical, alternate fixture probe locations. In the preferred embodiment, the probe location algorithm used to determine the preferred and alternate bead probe locations during the PCB development stage is also used to identify the preferred and alternate fixture probe locations for the fixture based on the released PCB design with test pads. Once the preferred and alternate fixture probe locations are known, an automated board pusher layout algorithm is preferably performed (step 312) to determine locations of board pushers in the top gate of the fixture in order to minimize board flex during test. In the preferred embodiment, points of maximum deflection on the PCB based on the fixture probe layout are automatically determined and board pushers are added to the fixture design at those points. Once the preferred fixture probe locations are known, tester resources can be assigned (step 314), and fixture build files containing drill data (where to drill, size of hole, depth of hole, which fixture layers, etc), insertion data (where and what to insert—e.g., probes, retainers, screws, board pushers, etc.), and wire data (map of personality pins to fixture probes to be wired) are generated for build (step 316). The fixture build design files may then be released for build (step 318) and the fixture can then be built (step 319).

Figure 4:
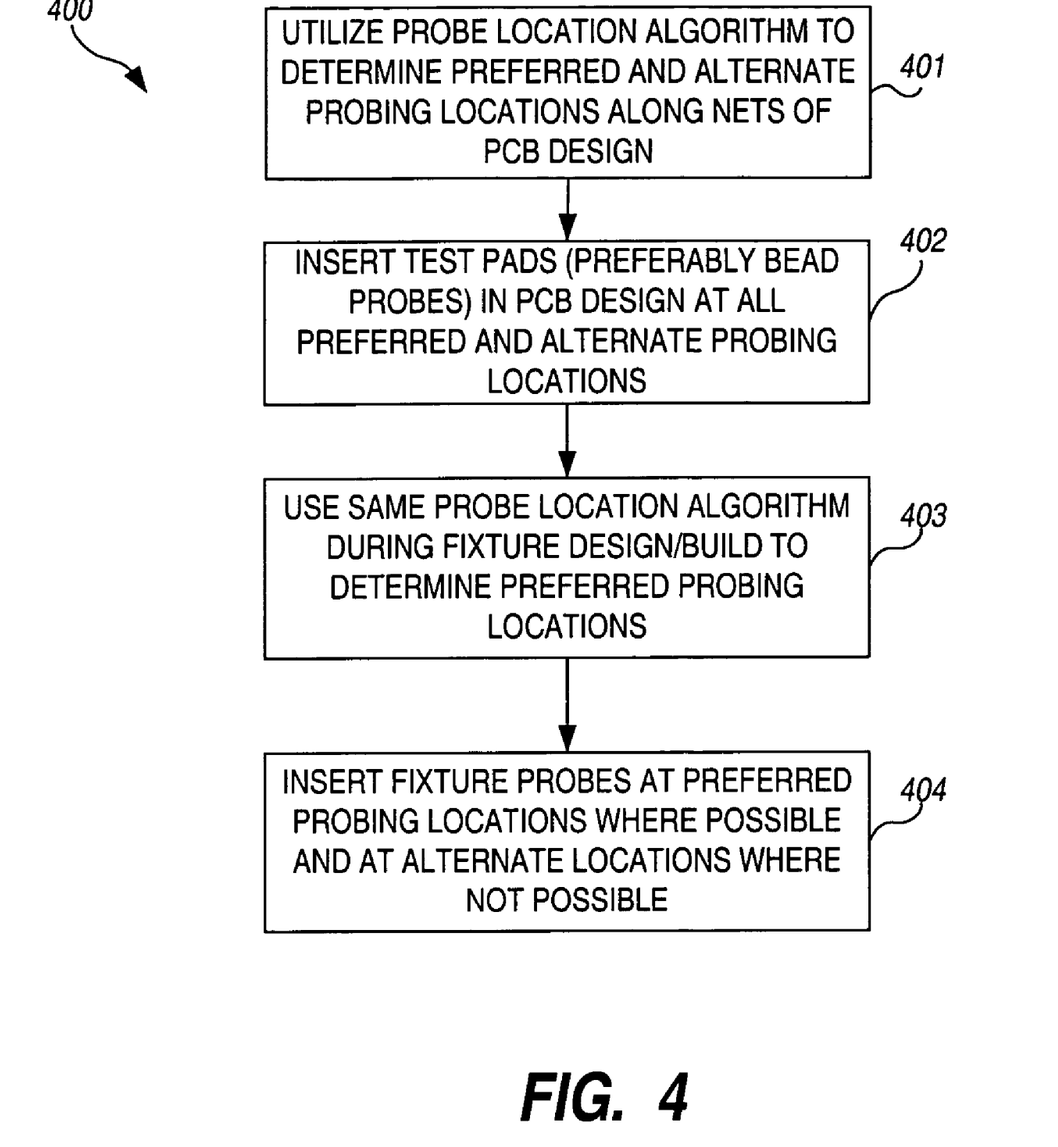
FIG. 4 is a flowchart of a preferred method of operation of implicitly encoding preferred probing locations in the PCB design itself during PCB design and implicitly decoding preferred probing locations during fixture design.

According to another aspect of the present invention, a technique is provided for determining preferred and alternate probing locations on nets of the PCB to allow for alternate probing locations on these nets. The invention includes a technique for implicitly encoding the preferred probing locations in the PCB design itself during PCB design, and for implicitly decoding the preferred probing locations during fixture design, in order to protect disclosure of the preferred probing locations only to authorized fixture builders. According to a preferred method 400, as illustrated in FIG. 4, a probe location algorithm determines preferred and alternate locations of bead probes along nets of the PCB design (step 401). Test pads, preferably in the form of bead probes, are inserted in the PCB design at all of the preferred and alternate bead probe locations (step 402). The same probe location algorithm is then used during fixture design/build to determine the preferred probing locations (step 403). Because the probe location algorithm is the same as that used during PCB design to determine placement of probing locations, including the preferred and alternate bead probe locations, the preferred bead probe locations are implicitly encoded in the PCB design itself, and the probe location algorithm operates as decoder for identifying the preferred fixture probe locations corresponding to the preferred bead probe locations.

Figure 5:
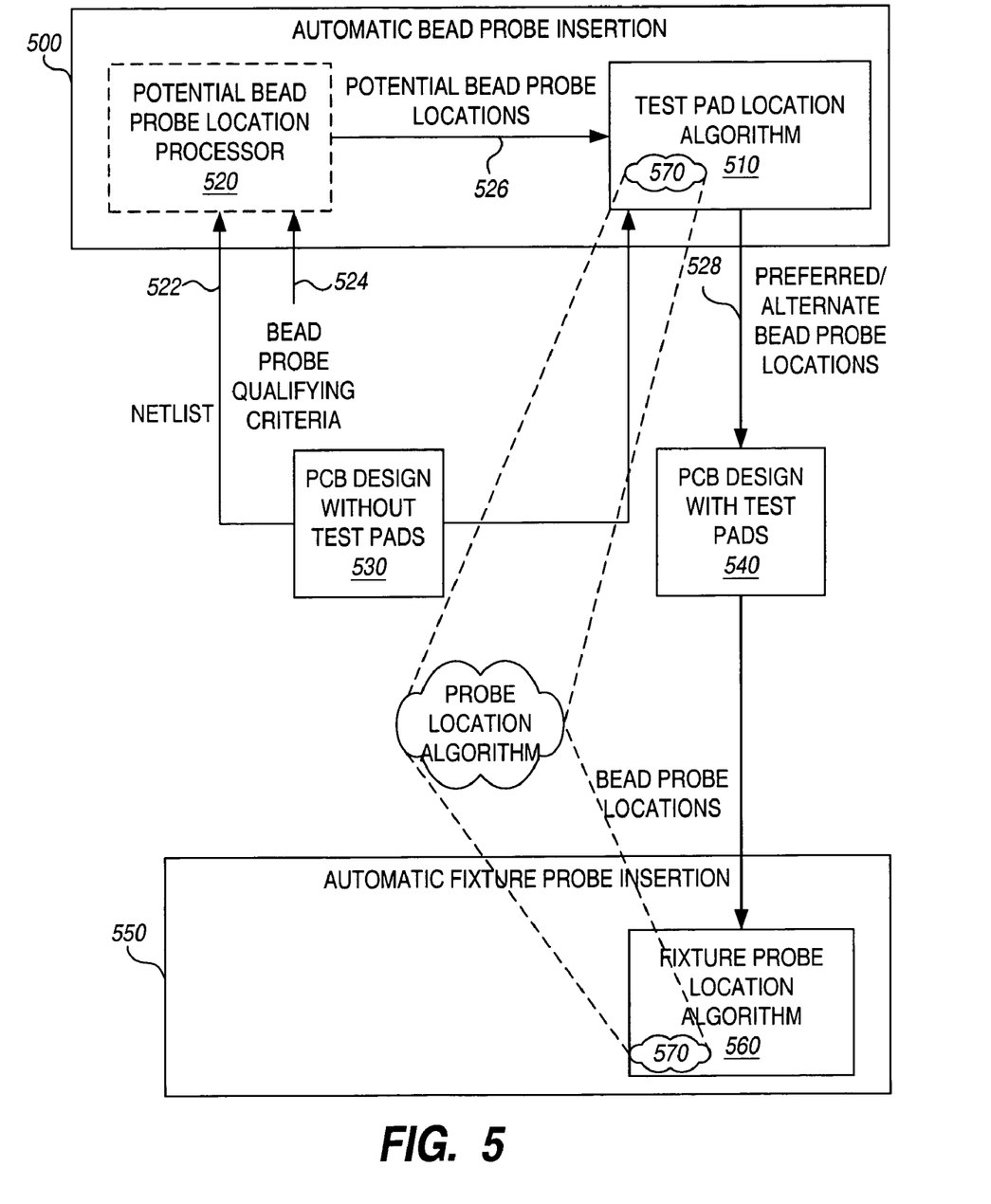
FIG. 5 is a block diagram illustrating a system that implements a preferred embodiment of the invention.

FIG. 5 is a block diagram illustrating a system that implements a preferred embodiment of the invention. As shown, the system comprises two key software modules. The first module, herein called the automatic bead probe insertion software 500 is a program (or set of programs) that is run when the PCB design layout is complete, prior to sending the PCB CAD data on to test development or fixture build. The second module, herein called the automatic fixture probe insertion software 550, is a program that is run when the fixture is designed for build.

In the preferred embodiment, the automatic bead probe insertion software 500 includes a potential bead probe location processor 520 that processes each net 522 to be probed on a PCB and generates a list of potential bead probe locations 526 that includes a number of possible locations on that net that meet the qualifying bead probe criteria 524. Because bead probes may be added anywhere along a net, there may be many locations along every trace that meet the qualifying bead probe criteria 524; accordingly, for practical purposes and to limit the algorithm processing time, the number of locations in the list of potential bead probe locations 526 may be artificially limited (i.e., fewer possible locations may be included in the list 526 than actually meet the qualifying bead probe criteria 524).

The automatic bead probe insertion software 500 utilizes a layout-independent test pad location algorithm 510 which automates the positioning and addition of test pads to a PCB design without altering the layout of the PCB design. Likewise, the automatic fixture probe insertion software 550 utilizes a fixture probe location algorithm 560 which automates the positioning of fixture probes in a corresponding fixture built for testing the PCB. In the preferred embodiment, the layout-independent test pad location algorithm 510 and the fixture probe location algorithm 560 each utilize a common probe location algorithm 570 for determining preferred and alternate probing locations given a set of alternate test pad locations or fixture probe locations, respectively.

In the preferred embodiment, the test pads are implemented as bead probes along traces of the PCB. The test pad location algorithm 510 utilizes probe location algorithm 570 to determine locations of bead probes on the PCB. Since bead probes may be added to PCB designs without requiring net re-routing, in principle, as previously described, any net having at least a portion of the net implemented in an exposed layer of the PCB (i.e., is implemented on an outer PCB layer that is accessible for probing) can have a bead probe placed anywhere along the exposed portion of the net provided that the fixture probe probing the bead probe will not strike a nearby component on the board or interfere with a nearby fixture probe. The number of potential probing locations on a given net can therefore be quite high, allowing a high degree of flexibility in choosing the locations to probe. The question then becomes how does the potential bead probe location processor 520 choose the best location for each net to be probed in terms of achieving optimal probing conditions across the entire board or at least a region of the board.

Minimizing board flex provides an answer. Ideally, the test pads (locations at which probing force is applied) would be evenly distributed across the PCB in order to minimize the board flex of the PCB. However, given typical component package form factors and surrounding trace patterns resulting therefrom, it may not be possible to evenly distribute the test pads across the board. For example, a ball grid array (BGA) component typically results in concentrations of nets within and near the vicinity of the BGA component's floorplan coordinates. Therefore, the concentration of these nets may be such as not to allow even distribution of probing force in terms not only of the entire board itself, but also even within the local vicinity of the BGA component.

As stated earlier, the test pad location algorithm 510 utilizes a probe location algorithm 570 to choose the locations of the bead probes along the exposed portions of nets of the PCB given a list of potential bead probe locations. The probe location algorithm attempts to choose an optimal location from among a list 526 of potential bead probe locations, the optimal location being designated as the "preferred" bead probe location. Because a bead probe can be fabricated at essentially any location along an exposed portion of a net without impacting the electrical characteristics of the net, as discussed previously, there is a high degree of flexibility in choosing the actual location(s) of the test pad(s) along each net. However, because the number of potential bead probe locations may be quite high, as also discussed previously, for practical purposes (e.g., reducing processing time) the list of potential bead probe locations may be artificially limited based on parameters such as minimum distance between bead probes, number of bead probes per predefined net length, etc. The probe location algorithm 570 preferably selects from the list of potential bead probe locations at least a "preferred" bead probe location, and preferably also one or more "alternate" bead probe locations.

Since bead probes have minimal impact on the size and electrical characteristics of the PCB, it is preferable to implement bead probes not only in the preferred probing location along the net, but also in one or more alternate probing locations on many of the nets in order to allow for post-fabrication design changes (typically referred to as Engineering Change Orders (ECOs)) or to avoid interference with other fixture components. In the preferred embodiment, all bead probes, including those designated as preferred probing locations and those designated as alternate probing locations, are automatically added to the PCB design without test pads 530 (i.e., PCB CAD files) to generate a PCB design with test pads 540, and are implemented during PCB fabrication regardless of which probing location (preferred or alternate) ends up being actually probed during test.

During test, only one bead probe per net (either the preferred bead probe or one of the alternate bead probes) is probed. Therefore, if alternate probing locations are implemented on a net, the fixture designer must select only one probing location from among the preferred and alternate probing locations and implement only one fixture probe for probing the corresponding bead probe at the selected probing location. Since the preferred locations are calculated as the "best" probing locations in terms of board flex of the PCB under test, ideally the fixture design will implement fixture probes at fixture positions that correspond to all (or as many as possible) preferred probing locations. However, where preferred probing locations interfere with certain fixture components such as spacers, retainers, other fixture probes, the fixture design may implement fixture probes at fixture positions that correspond to several of the alternate probing locations.

In principle, of course, because the preferred probing location is the location that will minimize board flex, it is desirable that the fixture designer select the preferred probing location for every net. This may be addressed in one of two ways: (1) the PCB designer can directly communicate to the fixture builder which of the bead probes are preferred probing locations; or (2) the fixture builder can utilize the same probe location algorithm used by the PCB designer in determining the preferred probing locations on the board to determine the preferred fixture probe locations.

In this second method, the fixture designer/builder is provided with the PCB design with test pads inserted and the probe location algorithm 570. By running the same probe location algorithm 570 that was used by the PCB designer in determining the preferred and alternate probing locations of the bead probes on the PCB, the fixture builder can then identify the preferred probing locations on each net. Preferably, during fixture build, fixture probes are then inserted in the fixture at locations corresponding to the preferred probing locations on the PCB to be tested. At alternate probing locations, holes are preferably pre-drilled in the fixture; however, no actual probe is inserted in the pre-drilled holes. If, after fixture build, the PCB is subjected to an ECO that would require probing in one of the alternate probing locations rather than a preferred probing location, or if the other components in the fixture interfere with the preferred probing location within the fixture, the fixture probe that probes that preferred probing location may be removed from the fixture, and a fixture probe may be inserted in the fixture in the pre-drilled holes corresponding to the selected alternate probing location for the affected net(s).

It will be appreciated that since the fixture probe insertion software utilizes the same probe location algorithm to determine preferred and alternate fixture probe locations as used in the test pad insertion software to determine preferred and alternate bead probe locations, the preferred and alternate fixture probe locations for fixture build are implicitly encoded in the PCB CAD files. Because the preferred and alternate fixture probe locations can only be "decoded" by running the same probe location algorithm when determining fixture probe locations as was used during PCB design to determine bead probe locations, if the preferred locations of the bead probes are not provided in the fixture files, by definition only fixture builders who are provided with the probe location algorithm can determine the preferred fixture probe locations. Without this information, it is very difficult to optimally balance the board forces, which, as described previously, can lead to faulty or fatal test errors during test of PCBs using the fixture. Accordingly, this technique of implicitly encoding (during PCB design) and decoding (during fixture design/build) preferred and alternate probing locations with a common probe location algorithm may be used to inherently prevent unauthorized fixture design/build by providing access to the probe location algorithm to only authorized fixture designers/builders. Without access to the probe location algorithm, unauthorized fixture designers/builders cannot distinguish preferred probing locations from alternate probing locations in the PCB design. In other words, only by using the same probe location algorithm to locate fixture probes during fixture design/build that was used for locating and inserting test pads during PCB design will the fixture implement fixture probes at locations corresponding to the preferred test pad locations on the PCB. Thus, this implicit preferred probing location encode/decode scheme therefore assists in protecting relationships between PCB design companies and preferred fixture build vendors by raising a strong barrier to the unauthorized fixture builder's ability to build optimized tester fixtures from only the PCB design.

Figure 6:
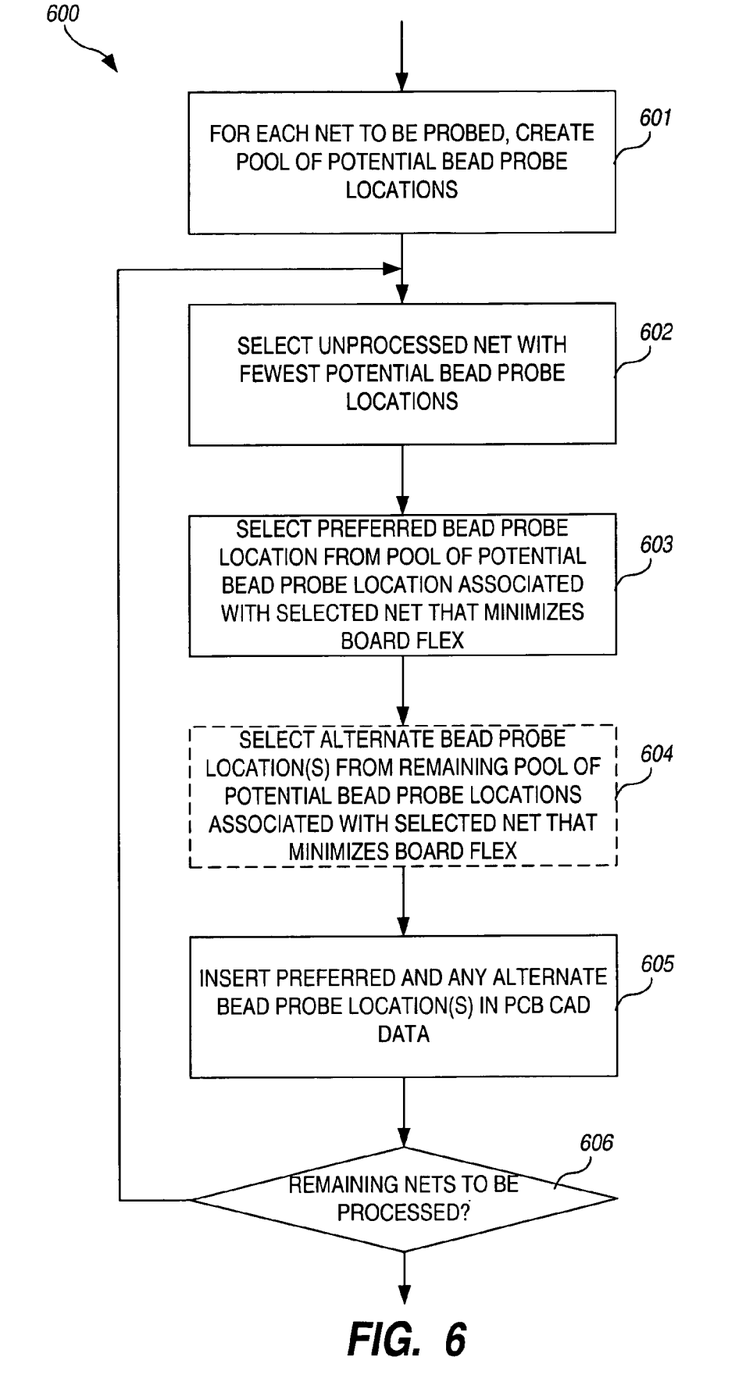
FIG. 6 is a flowchart of a preferred method of operation of the bead probe insertion software of FIG. 5.

FIG. 6 is an operational flowchart that illustrates the essential steps of the bead probe insertion software. Specifically, the bead probe insertion software creates a pool of potential bead probe locations for each net to be probed on the PCB (step 601). To qualify as a potential bead probe location, the location must be located somewhere along the net and must be located such that if the location were probed by a fixture probe during test, the fixture probe would not come into actual contact with nearby components on the board or other probes and/or components in the fixture. In other words, a potential bead location is a point on the net constrained by a set of qualifying criteria. As an example, even though bead probes are fabricated to vary in height (i.e., vary in the z-dimension relative to the x-y plane of the corresponding trace layer on the PCB), and therefore theoretically allow probing independent of the distances between neighboring traces, qualifying bead probe location criteria may still include minimum distance requirements between the proposed location and surrounding components to ensure unadulterated probing even if the fixture probes are not perfectly aligned with the bead probes on the PCB during test. Thus, for example, if a fixture probe head is not precisely horizontally aligned parallel to the x-y plane of the PCB, one edge of the probe head may in fact electrically contact a nearby trace. Accordingly, qualifying bead probe criteria may include a specification of minimum spacing between the potential probe location and other components (including traces) on the board.

After creating the pool of possible bead probe locations 526 for each net 522, the bead probe insertion software 600 iteratively selects each net to be probed (step 602), preferably beginning with the nets with the fewest possible potential bead probe locations, and applies a probe location algorithm (e.g., probe location algorithm 570) that selects a preferred bead probe location from among the pool of potential bead probe locations associated with the net being processed (step 603). In the preferred embodiment, the probe location algorithm attempts to balance bead probes on both the top and bottom of the PCB to minimize board flex and minimize supplemental board pushers that will preferably be added to the fixture to optimally minimize board flex.

The bead probe insertion software then preferably also selects one or more alternate bead probe locations on each net, if possible, to allow for future ECOs (step 604). The selection is preferably performed by removing the preferred bead probe location from consideration by the probe location algorithm and re-running the probe location algorithm.

The bead probe insertion software 500 then inserts bead probes into the PCB design CAD files at the selected preferred and alternate (if such exist) bead probe locations 528 associated with the net (step 605). If more nets remain in the PCB design to be processed, (determined in step 606), the algorithm iterates steps 602 through 606 until all nets have been processed.

Once the bead probes have been added to the PCB CAD files, the CAD data may then be released to the test developer. The PCB CAD data contains information for each component on the PCB, including but not limited to the x- and y-coordinates of the endpoints of each trace, thickness of each trace, layer of each trace, locations and z-dimension thickness of each bead probe to implemented on the trace, and x, y- and z-dimension vertices and rotational information of nearby components to define the outlines or boundaries of components on the board. Unlike the prior art PCB development cycle, however, the PCB CAD data now include ICT probing locations that (1) will not affect the board's electrical performance, (2) did not alter the trace layout of the PCB; (3) likely provides 100% probing access plus alternates for flexibility, (4) took little manual effort from the PCB designer, (5) include at least one location on each net that, if properly chosen, will optimize board flex, and (6) were determined quickly, accurately, and automatically, improving the time-to-market.

The test developer then translates the PCB CAD data into test data using test development software. During test development, fixture files are developed from the CAD data and sent to the fixture designer for fixture design/build. Included in the fixture files are the bead probe locations, both preferred and any existing alternate locations. While the preferred fixture probe locations may be designated in the fixture files as discussed above, in the preferred embodiment, the fixture designer/builder will run the second software module of the invention, namely the fixture probe insertion software 550 (FIG. 5).

Figure 7:
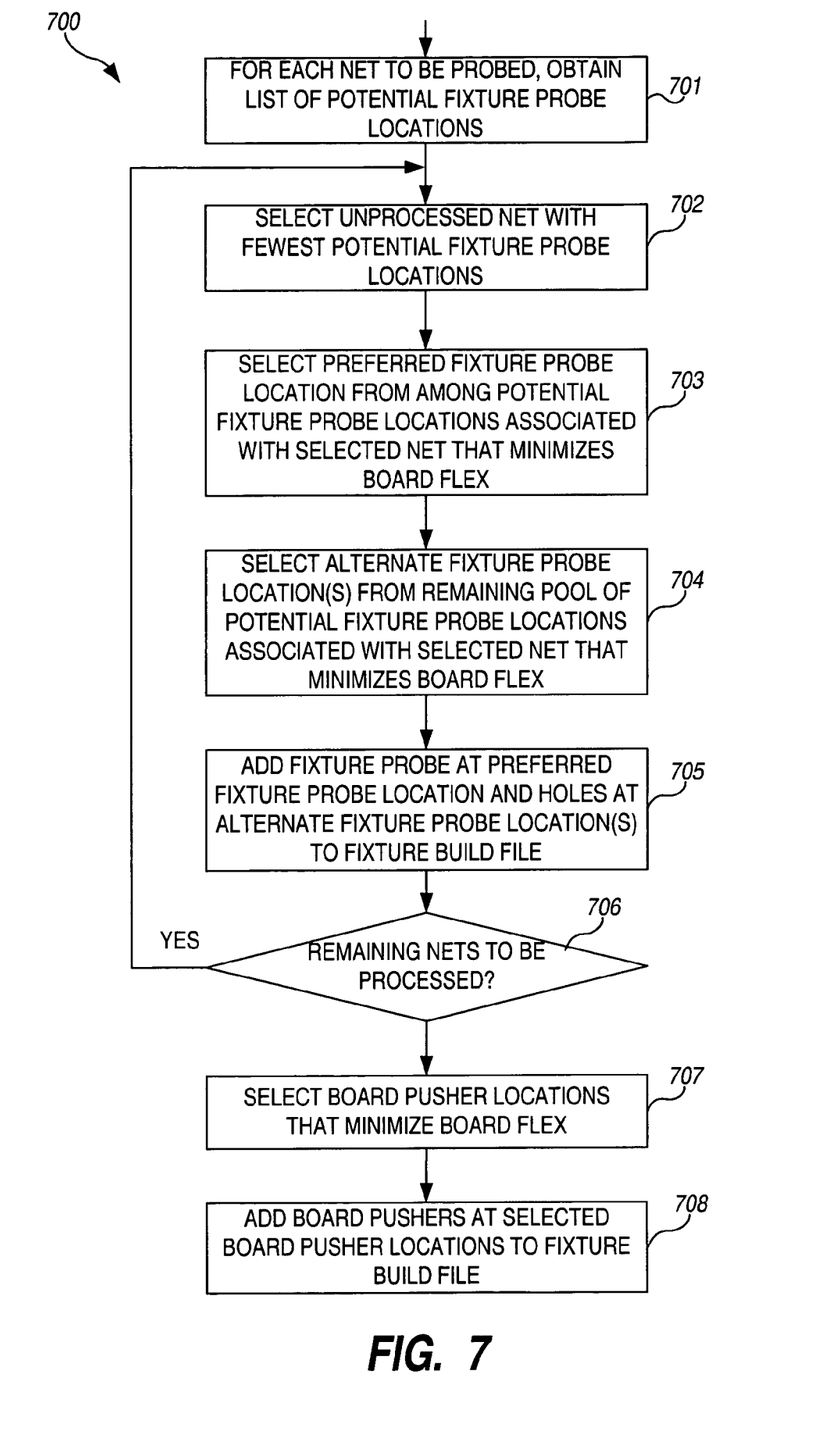
FIG. 7 is a flowchart of a preferred method of operation of the fixture probe insertion software of FIG. 5.

FIG. 7 is an operational flowchart that illustrates the essential steps of a preferred embodiment 700 of the fixture probe insertion software 550. As illustrated therein, the fixture probe insertion software 700 obtains a list of possible fixture probe locations for each net to be probed (step 701). Again, beginning with the nets with the fewest possible fixture probe locations, the fixture probe insertion software iteratively selects each net to be probed (step 702), preferably beginning with the nets with the fewest possible potential fixture probe locations, and applies a probe location algorithm that selects a preferred fixture probe location from among the pool of potential fixture probe locations associated with the net being processed (step 703). In the preferred embodiment, the probe location algorithm is the same probe location algorithm used to determine the locations of the bead probes in the PCB design; accordingly, the fixture probe insertion software will select fixture probe locations that will coincide with the preferred bead probe locations when the PCB is mounted in the fixture.

The fixture probe insertion software then preferably also selects one or more alternate fixture probe locations on each net, if possible, to allow for future ECOs (step 704). The selection is preferably performed by removing the preferred probing location from consideration by the probe location algorithm and re-running the probe location algorithm. Since in the preferred embodiment the probe location algorithm is the same as that used to determine the locations of the bead probes in the PCB design, the fixture probe insertion software will select alternate fixture probe locations that will coincide with the alternate bead probe locations when the PCB is mounted in the fixture.

The fixture probe insertion software then adds a fixture probe to the fixture build file at the selected preferred fixture probe location associated with the net, and, if alternate fixture probe locations exist for the net, adds holes to the fixture build file at the alternate fixture probe locations to allow for future insertion of actual probes in the alternate fixture probe locations in case the location of the physical fixture probe must be changed due to future ECO or other fixture design problems (step 705). The fixture probe insertion software iterates through all nets to be probed.

Once all nets to be probed have been processed (determined in step 706), the fixture probe insertion software adds board pushers to the fixture design (step 707). In the preferred embodiment, the step for adding board pushers to the fixture design is implemented using the support location algorithm described in U.S. patent application Ser. No. 10/215,108, supra, which finds the locations of board pushers that result in minimized board flex. Board pushers are then added to fixture build files from which the physical fixture will be built (step 708).

During fixture build, holes are drilled in the fixture plates and physical fixture probes are inserted in the fixture at the selected preferred fixture probe locations indicated in the fixture build file, and holes associated with alternate fixture probe locations are either fully or partially (i.e., may optimally be punched out) drilled in the fixture plates to allow insertion of a physical fixture probe therein if later needed. Board pushers are also added to the fixture where indicated in the fixture build file.

In summary, the invention provides a method for implicitly encoding preferred probing locations of nets in a PCB design by executing a probe location algorithm that predictably determines a respective preferred probing location from among a respective plurality of potential probing locations associated with the respective nets in the PCB design and adding a test pad to said PCB design at said respective preferred probing location and also at one or more alternate probing locations chosen from among remaining ones of the plurality of potential probing locations. The test pads are preferably implemented as bead probes. Providing the PCB design with test pads added and the probe location algorithm to the fixture designer allows the fixture designer to execute the probe location algorithm on the PCB design data to determine the respective preferred probing locations associated with said respective nets. Since the preferred probing locations can only be determined by execution of the probe location algorithm that initially selected the preferred test pads in the PCB design, the technique assists in protecting relationships between PCB design companies and preferred fixture build vendors by raising a strong barrier to the unauthorized fixture builder's ability to build optimized tester fixtures from only the PCB design.

Those of skill in the art will appreciate that the methods described and illustrated herein may be implemented in software, firmware or hardware, or any suitable combination thereof. Preferably, the method and apparatus are implemented in software, for purposes of low cost and flexibility, which run on computer hardware. Thus, those of skill in the art will appreciate that the method and apparatus of the invention may be implemented by a computer or microprocessor process in which instructions are executed, the instructions being stored for execution on a computer-readable medium and being executed by any suitable instruction processor. Alternate embodiments are contemplated, however, and are within the spirit and scope of the invention.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. An apparatus for determining fixture probe locations in a printed circuit board tester fixture based on a printed circuit board (PCB) design, said PCB design comprising one or more nets respectively having an associated preferred test pad implemented along said respective net at an associated preferred probing location and associated one or more alternate test pads implemented along said respective net at associated one or more alternate probing locations as determined by execution of a probe location algorithm that receives respective lists of potential test pad locations for said respective nets and respectively predictably determines said associated preferred probing location and said associated one or more alternate probing locations for said respective nets, comprising:
   a PCB design test pad location extraction function which respectively generates for one or more nets of said PCB design an associated test pad list comprising locations of said preferred test pad and said one or more alternate test pads associated with said respective net; and
   a processor which executes said probe location algorithm to determine said respective preferred probing locations associated with said one or more nets, using said respective test pad lists associated with said one or more nets as said respective lists of potential test pad locations.

2. An apparatus in accordance with claim 1, wherein said preferred test pad and said one or more alternate test pads comprise bead probes.

3. An apparatus in accordance with claim 1, comprising:
   a fixture probe insertion function which inserts one or more respective fixture probes in a printed circuit board tester fixture design at respective preferred probing locations such that tips of said respective fixture probes exactly align with corresponding preferred test pads of a PCB implemented in accordance with said PCB design when said PCB is mounted in a printed circuit board tester fixture implemented in accordance with said printed circuit board tester fixture design.

4. An apparatus in accordance with claim 1, comprising:
   a fixture probe insertion function which determines whether any fixture component currently existing in a printed circuit board tester fixture design would interfere with a respective fixture probe positioned at a position in a printed circuit board tester fixture implementing said printed circuit board tester fixture design to exactly align with a corresponding preferred test pad of a PCB implemented in accordance with said PCB design when said PCB is mounted in said printed circuit board tester fixture, arid, where no fixture component currently existing in said printed circuit board tester fixture design would interfere with said respective fixture probe positioned at said position, inserts said respective fixture probe in said printed circuit board tester fixture design at said position.

5. An apparatus in accordance with claim 4, wherein:
   where a fixture component currently existing in said printed circuit board tester fixture design would interfere with said respective fixture probe positioned at said position, said fixture probe insertion function finds an alternate position in said printed circuit board tester fixture implementing said printed circuit board tester fixture design to exactly align with a corresponding alternate test pad of a PCB implemented in accordance with said PCB design when said PCB is mounted in said printed circuit board tester fixture that does not interfere with a fixture component currently existing in said printed circuit board tester fixture design and inserts a respective fixture probe in said printed circuit board tester fixture design at said alternate position.

6. A method for determining fixture probe locations in a printed circuit board tester fixture, said method comprising the steps of:
   obtaining a PCB design, said PCB design comprising one or more nets respectively having an associated preferred test pad implemented along said respective net at an associated preferred probing location and associated one or more alternate test pads implemented along said respective net at associated one or more alternate probing locations as determined by execution of a probe location algorithm that receives respective lists of potential test pad locations for said respective nets and respectively predictably determines said associated preferred probing location and said associated one or more alternate probing locations for said respective nets;
   executing said probe location algorithm to respectively determine said associated preferred probing location for said one or more nets, wherein said respective lists of potential test pad locations associated with said respective nets respectively comprise locations of said associated preferred test pad and said associated one or more alternate test pads implemented along said respective nets; and
   inserting one or more respective fixture probes in a printed circuit board tester fixture design at respective preferred probing locations such that tips of said respective fixture probes exactly align with corresponding preferred test pads of a PCB implemented in accordance with said PCB design when said PCB is mounted in a printed circuit board tester fixture implemented in accordance with said printed circuit board tester fixture design.

7. A method in accordance with claim 6, further comprising: building a printed circuit board tester fixture to implement said printed circuit board tester fixture design.

8. A method in accordance with claim 6, wherein said preferred test pad and said one or more alternate test pads comprise bead probes.

9. A method in accordance with claim 6, further comprising:
- determining whether any fixture component currently existing in a printed circuit board tester fixture design would interfere with a respective fixture probe positioned at a position in a printed circuit board tester fixture implementing said printed circuit board tester fixture design to exactly align with a corresponding preferred test pad of a PCB implemented in accordance with said PCB design when said PCB is mounted in said printed circuit board tester fixture; and
- where no fixture component currently existing in said printed circuit board tester fixture design would interfere with said respective fixture probe positioned at said position, inserting said respective fixture probe in said printed circuit board tester fixture design at said position.

10. A method in accordance with claim 9, further comprising the step of:
- where a fixture component currently existing in said printed circuit board tester fixture design would interfere with said respective fixture probe positioned at said position, finding an alternate position in said printed circuit board tester fixture implementing said printed circuit board tester fixture design to exactly align with a corresponding alternate test pad of a PCB implemented in accordance with said PCB design when said PCB is mounted in said printed circuit board tester fixture that does not interfere with a fixture component currently existing in said printed circuit board tester fixture design; and
- inserting a respective fixture probe in said printed circuit board tester fixture design at said alternate position.

11. A method in accordance with claim 10, further comprising:
- building a printed circuit board tester fixture to implement said printed circuit board tester fixture design.

12. A computer readable storage medium tangibly embodying program instructions which, when executed by a computer, implements a method for determining fixture probe locations in a printed circuit board tester fixture, said method comprising the steps of:
- obtaining a PCB design, said PCB design comprising one or more nets respectively having an associated preferred test pad implemented along said respective net at an associated preferred probing location and associated one or more alternate test pads implemented along said respective net at associated one or more alternate probing locations as determined by execution of a probe location algorithm that receives respective lists of potential test pad locations for said respective nets and respectively predictably determines said associated preferred probing location and said associated one or more alternate probing locations for said respective nets;
- executing said probe location algorithm to respectively determine said associated preferred probing location for said one or more nets, wherein said respective lists of potential test pad locations associated with said respective nets respectively comprise locations of said associated preferred test pad and said associated one or more alternate test pads implemented along said respective nets; and
- inserting one or more respective fixture probes in a printed circuit board tester fixture design at respective preferred probing locations such that tips of said respective fixture probes exactly align with corresponding preferred test pads of a PCB implemented in accordance with said PCB design when said PCB is mounted in a printed circuit board tester fixture implemented in accordance with said printed circuit board tester fixture design.

13. A computer readable storage medium in accordance with claim 12, said method further comprising the steps of:
- determining whether any fixture component currently existing in a printed circuit board tester fixture design would interfere with a respective fixture probe positioned at a position in a printed circuit board tester fixture implementing said printed circuit board tester fixture design to exactly align with a corresponding preferred test pad of a PCB implemented in accordance with said PCB design when said PCB is mounted in said printed circuit board tester fixture; and
- where no fixture component currently existing in said printed circuit board tester fixture design would interfere with said respective fixture probe positioned at said position, inserting said respective fixture probe in said printed circuit board tester fixture design at said position.

14. A computer readable storage medium in accordance with claim 13, said method further comprising the step of:
- where a fixture component currently existing in said printed circuit board tester fixture design would interfere with said respective fixture probe positioned at said position, finding an alternate position in said printed circuit board tester fixture implementing said printed circuit board tester fixture design to exactly align with a corresponding alternate test pad of a PCB implemented in accordance with said PCB design when said PCB is mounted in said printed circuit board tester fixture that does not interfere with a fixture component currently existing in said printed circuit board tester fixture design; and
- inserting a respective fixture probe in said printed circuit board tester fixture design at said alternate position.

* * * * *

UNITED STATES PATENT AND TRADEMARK OFFICE
CERTIFICATE OF CORRECTION

PATENT NO. : 7,187,165 B2 Page 1 of 1
APPLICATION NO. : 11/010074
DATED : March 6, 2007
INVENTOR(S) : Jacobsen et al.

It is certified that error appears in the above-identified patent and that said Letters Patent is hereby corrected as shown below:

In column 14, line 8, in Claim 4, delete "arid" and insert -- and --, therefor.

Signed and Sealed this

Twenty-sixth Day of June, 2007

JON W. DUDAS
*Director of the United States Patent and Trademark Office*